United States Patent [19]

Hasegawa

[11] Patent Number: 4,999,273

[45] Date of Patent: Mar. 12, 1991

[54] PRESENSITIZED PLATE

[75] Inventor: Akira Hasegawa, Shizuoka, Japan

[73] Assignee: Fuji Photo Film Co., Ltd., Minami-Ashigara, Japan

[21] Appl. No.: 560,292

[22] Filed: Jul. 27, 1990

Related U.S. Application Data

[63] Continuation of Ser. No. 264,889, Oct. 31, 1988, abandoned, which is a continuation-in-part of Ser. No. 39,730, Apr. 20, 1987, abandoned.

[30] Foreign Application Priority Data

Apr. 23, 1986 [JP] Japan .................................. 61-93533

[51] Int. Cl.$^5$ ................................................ G03C 1/72
[52] U.S. Cl. ..................................... 430/138; 430/271; 430/275; 430/278; 430/281
[58] Field of Search ............... 430/138, 271, 275, 278, 430/281

[56] References Cited

U.S. PATENT DOCUMENTS 4,532,200 7/1985 Arney et al. ......................... 430/211
4,592,957 6/1986 Dahm et al. ......................... 430/903
4,637,725 8/1987 Wright et al. ....................... 430/138

FOREIGN PATENT DOCUMENTS 58-224752 6/1983 Japan .

Primary Examiner—Jack P. Brammer
Attorney, Agent, or Firm—Burns, Doane, Swecker & Mathis

[57] ABSTRACT

A positive-working type presensitized plate which comprises a hydrophilic support having provided thereon a layer which contains (i) microcapsules containing a photo-polymerizable monomer and/or light-sensitive resin and having a lipophilic wall membrane and (ii) a hydrophilic binder.

This positive-working type presensitized plate has a high sensitivity and good development processing property, and from the presensitized plate a lithographic printing plate can be prepared having image areas of high printing durability and high ink-receptivity and causing no background contamination.

27 Claims, No Drawings

PRESENSITIZED PLATE

RELATED APPLICATIONS

This application is a continuation of application Ser. No. 264,889, filed Oct. 31, 1988, which is a continuation-in-part of application Ser. No. 039,730, filed Apr. 20, 1987, both now abandoned.

BACKGROUND OF THE INVENTION

1. Field of the Invention

The present invention relates to a presensitized plate, more specifically to a positive-working type presensitized plate (hereinafter referred to as a positive-working PS plate) having a high sensitivity.

2. Description of the Prior Art

Heretofore, positive-working PS plates which comprise a grained hydrophilic aluminum support having coated thereon a layer containing an orthoquinonediazide compound and a phenol resin have widely been used.

Such positive-working PS plates utilize a property of the orthoquinonediazide compound that it decomposes by irradiation of actinic light to form a five-membered carboxylic acid which is alkali soluble, but have a defect that their sensitivities are inadequate. This defect is based on the fact that in the orthoquinonediazide compound quantum yield does not exceed one essentially.

Trials for enhancing the sensitivity of a light-sensitive composition containing an orthoquinonediazide compound have hitherto been conducted, but it has been very difficult to enhance the sensitivity while maintaining development latitude. Such trials are disclosed, for example, in Japanese Published Examined Patent Application No. 12242/1973, Japanese Published Unexamined Patent Application No. 40125/1977, and U.S. Pat. No. 4,307,173.

Further, several proposals have recently been made as to a light-sensitive composition which acts positively without using an orthoquinonedizaide compound. One of such compositions contains a polymer compound having an orthonitrocarbinol ester group as disclosed in Japanese Published Examined Patent Application No. 2696/1981. However, the sensitivity of the composition is not adequate due to the same reason as in the orthoquinonediazide. Separately, as a process for enhancing the sensitivity of a light-sensitive composition, there is a process for enhancing the sensitivity by using a light-sensitive system which is activated through contact action, more specifically a process which comprises applying a known principle that exposure areas are solubilized by causing a second reaction with the acid which is formed by photolysis.

As the examples of such light-sensitive systems, combinations of a compound which forms an acid by photolysis with other compounds such as an acetal or O,N-acetal compound (Japanese Published Unexamined Patent Application No. 89003/1973), an orthoester or amidoacetal compound (Japanese Published Unexamined Patent Application No. 120714/1976), a polymer having an acetal or ketal group in the principal chain (Japanese Published Unexamined Patent Application No. 133429/1978), an enolether compound (Japanese Published Unexamined Patent Application No. 12995/1980) an N-acyliminocarbonic acid compound (Japanese Published Unexamined Patent Application No. 126236/1980), and a polymer having an orthoester group in the principal chain (Japanese Published Unexamined Patent Application No. 17345/1981) are mentioned. As quantum yields of these light-sensitive systems respectively exceed one, light-sensitive compositions containing these light-sensitive system generally seem to have a high sensitivity. However, the reaction rate of the reaction of an acid as formed by photolysis with an O,N-acetal compound or a polymer having an acetal or ketal group in the principal chain is generally late, a light-sensitive composition containing such a compound does not exhibit an adequate sensitivity in practical use. Further, though a light-sensitive composition containing an orthoester, amidoacetal, enolether or N-acyliminocarbonic acid compound indeed exhibits a high sensitivity, they have poor stability and cannot be preserved over a long period. A light-sensitive composition containing a polymer having an orthoester group in the principal chain also exhibits a high sensitivity, but has only a narrow development latitude in development.

Further, a method for making a lithographic printing plate by applying a layer containing photopolymerizable type microcapsules on a water resistant support, subjecting the applied surface to pattern exposure, pressurizing the surface and re-exposing the surface is disclosed in Japanese Published Unexamined Patent Application No. 224752/1983. The presensitized plate used in this method is highly sensitive and the method is a method wherein a lithographic printing plate is made through a dry treatment by utilizing the hydrophilic property of the microcapsule wall membrane and the lipophilic property of the photopolymerizable type resin. However, the thus obtained lithographic printing plate is inadequate in its hydrophilic property, is liable to form background contamination and has only a poor printing durability. Further, as the lipophilic property of the photopolymerizable type resin is impaired by the hydrophilic property of the microcapsule wall membrane, the lipophilic property of the printing plate is inadequate. As a result, the printing plate has a defect that the concentration of an ink applied thereon cannot be made high.

SUMMARY OF THE INVENTION

The purpose of the present invention is to provide a positive-working PS plate of a high sensitivity and good development processing property, from which a lithographic printing plate can be prepared having image areas of a high printing durability and high ink-receptivity and causing no background contamination on printed matters.

The purpose of the present invention can be attained by a positive-working PS plate which comprises a hydrophilic support having provided thereon a layer which contains (i) microcapsules containing a photopolymerizable monomer and/or light-sensitive resin and having a lipophilic wall membrane and (ii) a hydrophilic binder.

DETAILED EXPLANATION OF THE INVENTION

Image forming of the positive-working PS plate of the present invention can be conducted by various methods. The microcapsule of the present invention which mainly contains a photopolymerizable monomer and/or light-sensitive resin is hardened by light, and by heating or pressurizing the hardened microcapsule, softening, fusion or destruction of the microcapsule wall or release of the contents of the microcapsule do not occur. On the other hand, the microcapsules in the nonimage areas are stable during ordinary handling or under ordinary conditions, but softened, fused and destroyed by heating, and as a result the microcapsule wall and/or the contents of the microcapsules are mixed to form a lipophilic uniform film. The microcapsules in the nonimage areas are also destroyed by pressurization and thereby the microcapsule wall and/or the contents of the microcapsules are mixed to form a lipophilic uniform film.

Therefore, various methods can be adopted for making a lithographic printing plate from the positive-working PS plate of the present invention. Such methods include, for example, (1) pattern exposure → heating → wash off → gumming up, (2) pattern exposure → heating → whole surface exposure → wash off → gumming up, (3) pattern exposure → pressurization → whole surface exposure → wash off → gumming up, (4) thermal printing wash off → gumming up, (5) thermal printing → whole surface exposure → wash off → gumming up, (6) pressure printing → whole surface exposure → wash off → gumming up, and (7) to (12): in respective making methods of (1) to (6), the photohardened microcapsules (in case of (1) to (3), (5) and (6)) and microcapsules (in case of (4)) are removed on a printing machine to make nonimage areas without conducting wash off and gumming up. Further, it is also possible to conduct pressurization after heating, heating after pressurization or both at the same time. As it is possible to use small-sized microcapsules in use of the heating treatment, it is possible to obtain a positive-working PS plate having an excellent pattern-resolving power. The method where the optionally photohardened microcapsules are removed on a printing machine is preferable since printing can be conducted at once without conducting wash off and gumming up.

It is preferable that the lipophilic microcapsule wall which is advantageous to the present invention has a contact angle with water of 40 degrees or more and is substantially water soluble. Materials for forming such a wall film include polyurea, polyurethane, polyethylene, polyamide, polyester, polycarbonate, polyethyleneamine, phenol-formalin resins, melamine resins, vinyl polymer and copolymer, polyacrylonitrile, polyvinylacetal resins, cellulose acetate, polypropylene, polybutadiene and the like.

In order to obtain images of a high resolving power, it is preferable to use microcapsules having a small particle size of 5 microns or less and to fuse the microcapsules having a thermosoftening wall with heating to make a lipophilic uniform film.

Thermosoftening materials in the specification mean materials having a low glass transition temperature. When the glass transition temperature of the microcapsule wall is low, the microcapsule is softened at a low temperature. It is preferable that the glass transition temperature lie in the range of 60° to 300° C., particularly 70° to 250° C. and most preferably 80° to 220° C. The glass transition temperature is measured as follows.

Dynamic preservation modulus of elasticity (E') and dynamic loss modulus of elasticity of the sample film were measured by using DDV-II type RHEOVIBRON (manufactured and sold by TOYO BALDWIN Co. Ltd.), $\delta = E'/E''$ is calculated and a temperature which gives a peak tan $\delta$ is sought as the glass transition temperature.

The heating rate at that time was 2° C./min. When the glass transition temperature is lower, stability on time lapse is inferior, and when the glass transition temperature is higher, there is the possibility that the support is deformed or background contamination is formed during printing.

Preferred microcapsule wall-forming materials are polyurea, polyurethane, polyester, polycarbonate and polyamide, especially polyurea and polyurethane.

The microcapsule used in the present invention can be prepared according to a method known in the art. Such known methods include, for example, an interfacial polymerization method disclosed in U.S. Pat. No. 3,287,154, U.K. Patent No. 990,443, Japanese Published Patent Application Nos. 19574/1963, 446/1967 and 711/1967, a method where a polymer is deposited disclosed in U.S. Pat. Nos. 3,418,250 and 3,660,304, a method using an isocyanatepolyol wall-forming material disclosed in U.S. Pat. No. 3,796,669, a method using an isocyanate wall-forming material disclosed in U.S. Pat. No. 3,914,511, a method using an urea-formaldehyde type or urea-formaldehyde-resorcinol type wall-forming material disclosed in U.S. Pat. Nos. 4,001,140, 4,087,376 and 4,089,802, a method using a melamine-formaldehyde resin, hydroxypropylcellulose, etc. wall-forming material disclosed in U.S. Pat. No. 4,025,455, an in situ method by polymerization of a monomer disclosed in Japanese Published Examined Patent Application No. 9163/1961 and Japanese Published Unexamined Patent Application No. 9079/1976, an electrolytic dispersion and cooling method disclosed in U.K. Patent Nos. 952,807 and 965,074, a spray drying method disclosed in U.S. Pat. No. 3,111,407 and U.K. Patent No. 930,422, and the like. It is preferable to first emulsify the core material and then form a polymeric membrane as a microcapsule wall, though without being limited to it.

It is preferred to control particle sizes of the microcapsules to from 0.01 to 30 $\mu$, especially from 0.01 to 10 $\mu$ in view of handling properties, above all from 0.01 to 5 $\mu$ in view of pattern-resolving power.

The polymerizable monomer used in the present invention is a compound having one or preferably plural vinyl or vinylidene groups, and includes compounds having, for example, an acryloyl group, methacryloyl group, allyl group, unsaturated polyester group, vinyloxy group, acrylamido group, and the like.

Most typical photo-polymerizable monomers used in the present invention are a reaction product of a polyol, polyamine or aminoalcohol, etc. with an unsaturated carboxylic acid, and a reaction product of an acrylate or methacrylate having a hydroxyl group with a polyisocyanate. Typical examples of such compounds are, for example, polyethylene glycol diacrylate, propylene glycol dimethacrylate, pentaerythritol triacrylate, trimethylolpropane triacrylate, pentaerythritol tetraacrylate, hexanediol diacrylate, 1,2-butanediol diacrylate, tetrakis (β-acryloxyethyl)ethylenediamine, a reaction product of an epoxy resin with acrylic acid, a reaction product of methacrylic acid, pentaerythritol and acrylic acid; a condensate of maleic acid, diethylene glycol and acrylic acid; methyl methacrylate, butyl methacrylate, styrene, divinylbenzene, diallylnaphthalene, and the like. Polymerizable monomers usable in the present invention may further be selected from those disclosed in Japanese Published Unexamined Patent Application Nos. 52889/1974, 68641/1973 and 32586/1973, Japanese Published Examined Patent Application No.

7115/1974 and the like. These monomers may be used alone or in combination according to the desired purpose.

In general, these monomers absorb light at 300 nm or less in the ultraviolet region. Therefore, it is desirable to simultaneously use a light-sensitive material, in order to impart light sensitivity to the light in the ultraviolet to visible region to a light-sensitive layer, which absorbs light in such region and causes polymerization of monomers. Examples of the light-sensitive materials include compounds which are generally known as photopolymerization initiators as already disclosed in detail in, for instance, Kosar, "Light Sensitive Systems", John Wiley & Sons; Warashina et al., "Light-sensitive Resins" issued by Nikkan Kogyo Shinbunsha (newspaper publishing company); Kakuta et al., "Light-sensitive Resins", the Print Society.

Among a photopolymerizable monomer and a light-sensitive resin which should be used in the microcapsules, preferred is a photopolymerizable monomer. The amount of a photopolymerizable monomer contained in the microcapsules is 40 to 95 wt. % based on the total weight of the microcapsules. When the amount is less than 40 wt. %, the microcapsule wall becomes thicker and it becomes difficult for the monomer to go out therethrough (for instance, when it is heated). As a result, image forming property gets worse. On the other hand, when the amount is more than 95 wt. %, the microcapsule wall becomes thinner and it becomes easier for the monomer to go out therethrough. As a result, the light-sensitive layer becomes sticky and consequently difficult to be handled. For these reasons, the amount of the monomer contained in the microcapsules is preferably 50 to 90 wt. %, more preferably 60 to 85 wt. % based on the total weight of the microcapsule.

The photopolymerization initiators are, for example, aromatic ketones, quinone compounds, ether compounds and nitro compounds. Examples thereof are benzoquinone, phenanthrenequinone, naphthoquinone, diisopropylphenanthrenequinone, benzoisobutyl ether, benzoin, furoinbutyl ether, Michler's ketone, Michler's thioketone, tetraphenyl furoin dimer, fluorenone, trinitrofluorene, $\beta$-benzoylaminonaphthalene. These initiators ar used in an amount of 0.1 to 30% by weight based on the weight of vinyl compounds in the present invention.

Moreover, a polymer as disclosed in Japanese Patent Application No. 151864/1985 and Japanese Published Examined Patent Application No. 151864/1985 and Japanese Published Examined Patent Application Nos. 32714/1971 and 34041/1974 may be encapsulated in the microcapsule in order to make the hardening by photopolymerization more effective.

According to the present invention, the foregoing photopolymerizable monomer, photopolymerization initiator, light-sensitive resin or the like are then encapsulated into microcapsules. At this stage, a solvent may simultaneously be used, which may be a natural or synthetic oil which can be used alone or in combination. Examples of such solvents include cottonseed oil, kerosene, aliphatic ketone, aliphatic ester, paraffin, naphthene oil, alkylated biphenyl, alkylated terphenyl, chlorinated paraffin, alkylated naphthalene, and a diaryl ethane such as 1-phenyl-1-xylylethane, 1-phenyl-1-p-ethylphenyl ethane, 1,1'-ditolylethane.

The light-sensitive resins as used herein are, for instance, a cinnamate of polyvinyl alcohol; a light-sensitive resin comprising an azide compound and a cyclized rubber, or a styrene-butadiene copolymer; a diazo light-sensitive resin; a light-sensitive resin comprised of polyvinyl acetophenone and benzaldehyde.

In addition to the aforementioned compounds, the microcapsule according to the present invention may include a thermal polymerization inhibitor. Useful examples thereof include hydroquinone, p-methoxyphenol, di-tert-buty-p-cresol, pyrogallol, tert-butyl catechol, benzoquinone, 4,4'-thiobis(3-methyl-6-tert-butylphenol), 2,2'-methylene-bis(4-methyl-6-tert-butylphenol), and 2-mercaptobenzimidazole. Moreover, the microcapsule may contain a dye or pigment for the purpose of coloring the resulting light-sensitive layer and further a pH indicator as the printing-out agent and a dye as disclosed in Japanese Published Unexamined Patent Application No. 120354/1985.

For the purpose of the coloration of image areas, it may also be effective to encapsulate, into the microcapsule, either a coloring agent or a combination of a coloring agent and a color precursor which permits the formation of a colored material when it comes into contact with the coloring agent. The term "coloring agent" herein means a material capable of coloring because of the donation of an electron to other materials or receiving a proton from a proton-donor such as an acid. These coloring agents which may be used in the present invention are not restricted to specific compounds and in general they include compounds which are usually colorless and have a partial skeleton of for instance lactone, lactam, sultone, spiro pyran, ester or amide, the partial skeleton being cleaved or splitted when bringing it into contact with color precursor. Examples thereof are, for instance, Crystal Violet lactone, benzoyl leuco Methylene Blue, Malachite Green lactone, rhodamine $\beta$-lactam, 1,3,3-trimethyl-6'-ethyl-8'-butyoxyindolinobenzospiro pyran.

As color precursors for these coloring agents, there may be mentioned, for instance, phenol compounds, organic acids or metal salts thereof, oxybenzoates and clay. In particular, the developer desirably used in the present invention includes phenols and organic acids hardly soluble in water having a melting point of from 50° to 250° C., a particularly preferred range thereof being from 60° to 200° C.

Such phenol compounds include, for instance, 4,4'-isopropylidenediphenol (i.e., bisphenol A); p-tert-butylphenol; 2,4-dinitrophenol; 3,4-dichlorophenol; 4,4'-methylenebis(2,6-di-tert-butylphenol); p-phenylphenol; 4,4'-cyclohexylidenediphenol; 2,2'-methylenebis(4-tert-butylphenol); 2,2'-methylenebis($\alpha$-phenyl-p-cresol)thiodiphenol; 4,4'-thiobis(6-tert-butyl-m-cresol); sulfonyldiphenol; 1,1-bis(4-hydroxyphenyl)-n-dodeoane: 4,4-bis-(4-hydroxyhenyl-1-pentanoic acid ethyl ester; p-tert-butylphenol-formalin condensate and p-phenylphenol-formalin condensate.

Useful examples of the organic acids include 3- tert-butylsalicylic acid, 3,5-tert-butylsalicylic acid, 5-$\alpha$-methylbenzylsalicylic acid, 3,5-di-$\alpha$-methylbenzylsalicylic acid, 3-tert-octylsalicylic acid, 5-$\alpha$,$\tau$-dimethyl-$\alpha$-phenyl-$\tau$-phenylpropylsalicylic acid.

As the oxybenzoic acid ester, there may be mentioned, for example, ethyl p-oxybenzoate, butyl p-oxybenzoate, heptyl p-oxybenzoate and benzyl p-oxybenzoate.

The photohardenable microcapsule according to the present invention may contain a foaming agent for the purpose of effectively collapsing the microcapsule to release the content thereof during heating.

In the present invention, nitroso type compounds, sulfohydrazido type compounds which are hydrazine derivatives of organo sulfonic acids, hydrazo compounds and azo compounds may be used as such foaming agent.

Examples of the nitroso type compounds include dinitrosopentamethylenetetramine, N,N'-dimethyl-N,N'-dinitrosoterephthalamide and trinitrosotrimethylenetriamine.

As the sulfohydrazide type compounds, there may be mentioned, p-toluenesulfohydrazide, benezenesulfohydrazide, p,p'-oxybis(benzenesulfohydrazide), benzene-1,3-disulfohydrazide, 3,3'-disulfohydrazidephenyl sulfone, toluene2,4-disulfohydrazide, and p-p'-thiobis(benezenesulfohydrazide).

Examples of the hydrazo compounds include, for instance, hydrazodicarbamide, N,N-dibenzoylhydrazine, β-acetylphenylhydrazine, biurea and 1,1-diphenylhydrazine.

As the azo compounds there may be mentioned, for example, azobisisobutyronitrile, azodicarbonamide(azobisformamide), diazoaminobenzene and azocarboxylic acid diethyl ester (diethyl azodicarboxylate).

These organic foaming agents are all decomposed by heating and generate nitrogen gas. Although some compounds generated a small amount of carbon mononoxide, carbon dioxide and water vapor in addition to nitrogen gas, at least 60% of the total gas generated is composed of nitrogen gas. The amount of gases generated, in general, falls within the range of from 100 to 300 ml/g.

The foaming agent is used in an amount of 0.1 to 20% by weight based on the capsule.

The thermal decomposition temperature of these organic foaming agents falls within the range of from about 80° to about 300° C. In this respect, an auxiliary agent for thermal decomposition may also be used in the present invention to lower the decomposition temperature of the organic foaming agent. Examples of effective auxiliary agents for thermal decomposition include, urea and derivatives thereof, zinc white (zinc oxide), lead carbonate, lead stearate and glycolic acid.

Preferred examples of the auxiliary agent for thermal decomposition are urea and the derivatives thereof such as ethanolamine urea, guanylurea and aminoguanidine carbonate. The auxiliary agent for thermal decomposition is preferably used in an amount of about 30 to 60% by weight based on the organic foaming agent.

It is believed that the decomposition temperature of chemically pure azodicarbonamide is 230° C. The decomposition temperature thereof can be lowered to about 120° C. by the addition of a variety of auxiliary agents for thermal decomposition.

For the purpose of emulsification and dispersion in preparing microcapsules, a water soluble polymer and/or a surfactant may be used. The water soluble polymers used herein include anionic polymers, nonionic polymers and amphoteric polymers.

The anionic polymer may be a natural or a synthetic one having, for instance, groups such as —COO⁻ and —SO₃⁻. As the natural anionic polymer, there may be mentioned, for example, gum arabic, alginic acid; as the semisynthetic anionic polymer there may be mentioned, for instance, carboxymethylcellulose, phthalated gelatin, sulfated starch, sulfated cellulose and lignin sulfonic acid; and the synthetic anionic polymers include maleic anhydride type copolymers (inclusive of those hydrolyzed), (meth)acrylic acid type polymers and copolymers, vinylbenzenesulfonic acid type polymers and copolymers, and carboxylated polyvinyl alcohols.

Examples of the amphoteric polymer include gelatin.

As the surfactant, there may be mentioned, for instance, nonionic surfactants such as polyoxyethylene alkyl ethers, polyoxyethylene alkyl phenyl ethers, polyoxyethylene fatty acid esters, sorbitan fatty acid esters, polyoxyethylene sorbitan fatty acid esters and glycerin fatty acid esters; anionic surfactants such as fatty acid salts, salts of alkylsulfates, alkylbenzenesulfonic acid salts, alkylnaphthalensulfonic acid salts, salts of dialkyl sulfosuccinates, salts of alkyl phosphates, condensates of naphthalene sulfonic acid and formalin, and salts of polyoxyethylene alkylsulfates; cationic surfactants such as alkylamine salts, quaternary ammonium salts and polyoxyethylene alkylamine salts; and fluorine-containing surfactants. These surfactants or dispersion stabilizers may be used alone or in combination.

To emulsify or disperse the aforementioned ingredients, an apparatus for emulsifying is in general used. Preferred examples thereof are those capable of imparting a great shearing force to a liquid to be treated or those capable of applying ultrasonic energy thereto and, in particular, include a colloid mill, a homogenizer, a capillary-tube type emulsifying apparatus, a liquid siren, an electromagnetic striction type ultrasonic wave generator and an emulsifier provided with a Pollman tube, which can provide an excellent result.

The hydrophilic binder according to the present invention can be used alone or in combination. Typical hydrophilic binders are transparent or translucent hydrophilic binders which include natural materials such as gelatin, derivatives thereof, derivatives of cellulose (for example, carboxymethylcellulose and methylcellulose), and polysaccharides (for example, starch, and gum arabic); and synthetic polymeric materials, for example, water soluble polyvinyl compounds such as polyvinyl alcohol, polyvinyl pyrrolidone, acrylamide polymers, polyacrylic acid and vinyl acetate-acrylic acid copolymer.

The amount of a hydrophilio binder is preferably 0.05 to 20 wt. % based on the total weight of the microcapsules. When the amount is less than 0.05 wt. %, it becomes difficult to completely remove the light-sensitive layer in non-image areas during a wash off step. As a result, a printing ink tends to adhere to non-image areas and consequently to produce background contamination. On the other hand, the amount of more than 20 wt. % tends to weaken the mechanical and chemical strength of ink-receptive image areas, i.e. printing durability. For these reasons, the amount of the hydrophilic binder is more preferably 0.1 to 15 wt. %, most preferably 0.2 to 10 wt. % based on the total weight of the microcapsules.

As a support, various materials which are subjected to a hydrophilizing treatment may be used in the present invention. Such materials include paper; paper laminated with a plastic film such as polyethylene, polypropylene or polystyrene film; a metal plate such as aluminum, (inclusive of alloys thereof) zinc, iron or copper plate; sheet or film of plastics such as cellulose acetate, cellulose propionate, cellulose butyrate, polyethylene terephthalate, polyethylene, polystyrene, polypropylene, polycarbonate and polyvinyl acetal; and paper or a plastic film laminated with a metallic foil or deposited with a metal layer such as those listed above. The support may be subjected to surface roughening treating, according to need.

For example, an aluminum support is subjected to the following surface treatment. An aluminum support is grained, for example, by an electrochemical graining method where an aluminum plate is grained by electrifying it in a hydrochloric acid or nitric acid electrolyte; or a mechanical graining method such as a wire brush graining method where an aluminum surface is scraped with a metal wire, a ball graining method where an aluminum surface is grained with an abrasive ball and an abrasive, and a brush graining method where an aluminum surface is grained with a nylon brush and an abrasive, alone or in combination.

The thus grained aluminum plate is then chemically etched with an acid or alkali. When an acid is used as an etching agent, it costs a very long time to destroy the fine structure and thus use of an acid therefor is disadvantageous for an industrial application, whereas use of an alkali as an etching agent improves such affairs.

An alkali agent preferably usable for these purposes includes sodium hydroxide, sodium carbonate, sodium aluminate, sodium metasilicate, sodium phosphate, potassium hydroxide, lithium hydroxide and the like. Preferred ranges of concentration of an alkali agent and temperature of etching are respectively 1 to 50 weight % and 20° to 100° C., and a condition where an amount of aluminum dissolved is 5 to 20 $g/m^2$ is preferable.

Acid washing is conducted after the alkali etching in order to remove smuts which remain on the surface of the aluminum plate. An acid used includes nitric acid, sulfuric acid, phosphoric acid, chromic acid, hydrofluoric acid, borofluoric acid and the like.

Further, removal of smuts formed by electrochemical roughening treatment of an aluminum plate is carried out preferably according to a method where the plate is contacted with sulfuric acid of a temperature of 50° to 90° C. and a concentration of 15 to 65 weight % as disclosed in Japanese Published Unexamined patent Application No. 12739/1978, or a method where the plate is etched with an alkali as disclosed in Japanese Published Examined Patent Application No. 28123/1973.

The thus treated aluminum plate is usable as a support for application of the microcapsule, but in advance of it, the plate may also be subjected to a further treatment such as anodization and chemical treatment.

Anodization may be carried out according to a method which has hitherto been utilized. Specifically, an anodization film may be formed on an aluminum support surface by sending a direct or alternative current to the support in an aqueous or monoqueous solution of sulfuric acid, phosphoric acid, chromic acid, oxalic acid, sulfamic acid, benzenesulfonic acid and the like alone or in combination.

Anodization conditions cannot be determined wholesale as they vary depending on the kind of the electrolyte, but generally, an electrolyte concentration of 1 to 80 weight %, a solution temperature of 5° to 70° C., a current density of 0.5 to 60 amperes/$dm^2$, a voltage of 1 to 100 V and an electrolysis time of 10 to 100 seconds are preferred.

Among the above anodization methods, especially preferred are methods where anodization is conducted in sulfuric acid under a high current density as used in the invention, disclosed in British Patent No. 1,412,768, and a method where anodization is conducted using phosphoric acid as an electrolytic bath as disclosed in U.S. Pat. No. 3,511,661.

The anodized aluminum plate may further be treated according to a method of dipping it in an aqueous alkali metal silicate such as sodium silicate solution as disclosed in U.S. Pat. Nos. 2,714,066 and 3,181,461, or provided with an undercoat of a hydrophilic cellulose such as carboxymethylcellulose containing a water soluble metal salt such as zinc acetate as disclosed in U.S. Pat. No. 3,860,426.

A microcapsule solution to be coated on a support may contain a filler such as talc powder, glass powder, clay, starch, what powder, corn powder, Teflon (trademark) powder and polyethylene powder to improve close-contact between a PS plate and an original transparency.

A light-sensitive solution containing the microcapsules and the hydrophilic binder is applied to a support in an amount of usually 0.3 to 20 $g/m^2$, preferably 0.5 to 15 $g/m^2$, most preferably 1 to 10 $g/m^2$ as the weight of the microcapsules.

The microcapsule solution of the present invention may further contain various additives as hitherto have been used in a recording system such as a binder, antioxidant, dispersing agent, antifoaming agent, pigment, dye and surfactant. Application methods and use methods of a microcapsule solution are well known and for example, disclosed in U.S. Pat. Nos. 2,711,375 and 3,625,736, U.K. Patent No. 1,232,347, Japanese Published Unexamined Patent Application No. 44012/1975, 50112/1975, 127718/1975 and 30615/1975, U.S. Pat. Nos. 3,836,383 and 3,846,331 and the like, and these methods are applicable to the present invention.

Further, it is possible to provide a protective layer or mat layer for controlling the surface physical property of the PS plate.

The thus prepared positive-working PS plate is exposed to actinic light. Light sources of actinic light include, for example, a mercury lamp, metal halide lamp, xenon lamp, chemical lamp, carbon arc lamp, and the like. Further, scanning exposure by high density energy beams, i.e., laser beams or electron beams can also be used in the present invention. Such laser beams include, for example, helium-neon laser beams, argon laser beams, krypton ion laser beams, helium-cadmium laser beams and the like.

Further, thermal printing can also be conducted. A thermal printing apparatus such as a thermal printer which is used as a station of a word processor, and a thermal facsimile is used for thermal printing. As a method for heating after pattern exposure, a method where the positive-working PS plate is directly heated such as a method where the PS plate is heated with a heated roller containing a heater so that the roller is contacted with the light-sensitive surface, a method where a heat source such as a ribbon heater, sheathed heater and infrared heater is disposed around the surface of the PS plate at conveyance, a method where heated air is blown on the PS plate surface and a method where the PS plate is immersed in or contacted with a heated liquid, or a method where the PS plate itself generates heat through irradiation of electron beams, high-frequency waves or other electromagnetic waves, or the like can be utilized.

The temperature and time of the heating are to be determined depending o the quality of the microcapsule wallforming material, thickness of the wall, kind of the contents of the microcapsule such as a photopolymerizable monomer and light-sensitive resin and the like, and should not be limited to a specific value. An effective temperature range is 60° to 300° C., preferably 70° to 250° C., and particularly 80° to 220° C. When the temperature is 60° C. or less, a uniform lipophilic film can hardly be obtained, and in case of 300° C. or more there is a possibility that background contamination is formed. An effective heating time range is 1/20 to 20 minutes, preferably 1/15 to 15 minutes and particularly 1/10 to 10 minutes.

When the positive-working PS plate is pressurized, the pressurization can simply be conducted by passing it between two rolls. When heating and pressurization are used at the same time, the procedure can be conducted by passing the PS plate between two rolls which contain a heater or by passing it between two rolls immediately after the heating or in a heating zone. Pressure to be added is not to be limited to a specific value, and a practically preferred pressure is about 500 kg/cm$^2$ or less.

The lithographic printing plate as obtained in the present invention may further be subjected to a treatment for giving a lipophilic property for the purpose of improving printing property. As a solution used for the treatment, a solution mainly containing a polymer having a hydrophilic group or a metal salt thereof, and the like are mentioned.

The following are examples of the present invention, and the present invention should not be limited to them.

EXAMPLE 1

(1) A support was prepared as follows.

A support was prepared according to the method as disclosed in Japanese Published Unexamined Patent Application No. 28893/1981. That is, the surface of an aluminum plate having a thickness of 0.24 mm was grained using a nylon brush and a suspension of pumices in water, and then washed well with water. The surface was then etched by immersing in 10% sodium hydroxide at 50° C. for 60 seconds, washed with flowing water, neutralized and washed with 20% HN03, and washed with water. Then, the plate was subjected to electrolytic roughening treatment in a 1% aqueous nitric acid solution, using alternating waveform current of sinusoidal wave, with an electricity quantity at an anodic state of 160 coulombs/dm$^2$, under the condition of a ratio of electricity quantity at a cathodic state to that at an anodic state being 0.8, and with a voltage at an anodic state of 12.7 V. The surface roughness of the resulting plate was measured to be 0.6μ (expressed by Ra). The plate was successively immersed in 30% sulfuric acid and desmutted at 55° C. for 2 minutes. The plate was then anodized in 20% sulfuric acid with the current density of 2A/dm$^2$ to make the thickness of anodized coating to be 2.7 g/dm$^2$. Finally, the plate was immersed in a 2.5% aqueous sodium silicate solution at 70° C. for one minute, washed and then dried.

(2) A light-sensitive solution was prepared as follows.

First, 5 g of 2,2-dimethoxy-2-phenylacetophenone was dissolved in 40 g of trimethylolpropane triacrylate, and then, 15 g of TAKENATE DIION (manufactured and sold by TAKEDA PHAMACEUTICALS Co. Ltd.) was dissolved therein followed by stirring to make an oil phase.

This oil phase was emulsified and dispersed in 70 g of an aqueous 2% polyvinyl alcohol PVA-205 (manufactured and sold by KURARAY Co. Ltd.). Then, 20 g of a 1.67% aqueous diethylenetriamine solution was added to the emulsion at room temperature with stirring, and the mixture was successively stirred. Thirty minutes thereafter, the temperature of the mixture was raised to 40° C., and the mixture was stirred for an additional one hour and then cooled. An average particle size of the obtained microcapsules was 2.1μ.

(3) Then, 100 g of water and 1 g of white dextrin (manufactured and sold by NICHIDEN KAGAKU Co. Ltd.) were added to 50 g of the thus obtained microcapsule solution to obtain a light-sensitive solution. The solution was applied to the above aluminum support so that the applied weight after drying was 4.2 g/m$^2$ and the support was then dried to obtain a positive-working PS plate.

(4) Next, as a comparative example, the following light-sensitive solution was applied on the above support, and the support was dried at 100° C. for 2 minutes. The resultant applied amount was 2.3 g/m$^2$.

| Light-sensitive solution | |
|---|---|
| Condensate of a cresol-formaldehyde novolak resin with 1,2-naphthoquineone-2-diazido-5-sulfonyl chloride | 0.45 g |
| Cresol-formaldehyde novolak resin | 1.1 g |
| 1,2-Naphthoquinone-diazido-4-sulfonyl chloride | 0.02 g |
| OILBLUE #603 (manufactured and sold by ORIENT CHEMICAL INDUSTRY Co. Ltd.) | 0.01 g |
| Ethylene dichloride | 10 g |
| Methylcellosolve | 10 g |

(5) The same two gray scales having a concentration difference of 0.15 were respectively contacted with the positive-working PS plates of the above example or comparative example. Exposure was carried out using a carbon arc lamp of 30 amperes from a distance of 140 cm.

In order to exhibit an excellent sensitivity of the positive-working PS plate of the present invention, the exposed plate of Example 1 was heated at 180° C. for one minute and then washed off using a sponge. On the other hand, the exposed plate of the comparative example was developed by immersing it in an aqueous solution obtained by diluting DP-4 (a trade name, manufactured and sold by FUJI PHOTO FILM Co. Ltd.) by 10-fold at 25° C. for 60 seconds. In both cases the exposure time when the fifth step of the gray scale having a concentration difference of 0.15 was completely made clear was measured. The result is shown in Table 1.

TABLE 1

| Sample | Exposure time |
|---|---|
| Example 1 | 2 sec. |
| Comparative example 1 | 200 sec. |

As is seen from Table 1, the positive-working PS plate of the present invention (Example 1) has a remarkably shorter exposure time and higher sensitivity than that of the comparative example 1.

Both PS plates were set on a HEIDELBERG G.T.O. type printing machine and subjected to printing, whereby printed matter having no background contamination was obtained in both cases.

EXAMPLE 2

(1) A light-sensitive solution was prepared as follows.

First, 30 g of trimethylolpropane triacrylate, 3 g of 2,2-dimethoxy-2-phenylacetophenone and 15 g of BURNOCK DN 950 (manufactured and sold by DAINIPPON INK AND CHEMICALS Inc.) were mixed to make an oil phase.

The oil phase was emulsified and dispersed in a 20% aqueous methylcellulose solution. Then, 10 g of a 1.67% aqueous diethylenetriamine solution was added to the emulsion with stirring at room temperature and the mixture was successively stirred. Thirty minutes thereafter, the temperature of the mixture was raised to 40° C. and the mixture was stirred for an additional 30 minutes and then cooled. The average particle size of the obtained microcapsules was 2.4μ.

(2) The thus obtained microcapsule solution was applied on the aluminum support disclosed in Example 1 so that the applied amount after drying was 4.2 g/m². The support was dried to obtain a positive-working PS plate.

(3) A positive film was superposed on the positive type PS plate. The resulting plate was subjected to vacuum contact, exposed using ET 26 V UDNS ULTRA-PLUS FLIP-TOP PLATE MAKER (manufactured and sold by nuARC IND. INC.), heated for 1 minute in an air constant temperature bath of 150° C., and then subjected again to whole surface exposure to obtain a lithographic printing plate.

(4) As in comparative example 2, a lithographic printing plate was obtained according to the process disclosed in Example I of Japanese Published Unexamined Patent Application No. 224752/1983.

(5) These printing plates were respectively set on a HEIDELBERG G.T.O. type printing machine and subjected to printing. As a result, in case of the comparative example 2 background contamination was formed even after 500 sheets or more were printed, whereas in case of the example of the present invention 1,000 or more sheets of printed matter having no background contamination were obtained.

What is claimed is:

1. A positive-working type presensitized plate which consists essentially of a support subjected to a hydrophilizing treatment and having provided thereon a layer which consists essentially of (i) 0.3 to 20 g/m² of microcapsules consisting essentially of 40 to 95% by weight, based on total weight of the microcapsules, of an ethylenically unsaturated photopolymerizable monomer and having a lipophilic wall membrane made of at least one member selected from the group consisting of a polyurea, polyurethane, polyethylene, polyamide, polyester, polycarbonate, polyethyleneamine, phenol-formalin resin, melamine resin, vinyl polymer, vinyl copolymer, polyacrylonitrile, polyvinylacetal resin, cellulose acetate, polypropylene and polybutadiene, said lipophilic wall membrane in non-exposed areas having the ability to form a lipophilic uniform film and (ii) 0.05 to 20% by weight, based on the total weight of the microcapsules, of a hydrophilic binder, wherein (1) the microcapsules contain 0.1 to 30% by weight based on the total weight of the photopolymerizable monomer, of a photopolymerization initiator capable of adsorbing light at ultraviolet to visible region and initiating polymerization of the photopolymerizable monomer (2) the particle size of the microcapsules is 0.01 to 30 μ and (3) the microcapsule wall has a contact angle with water of 40 degrees or more and is substantially water insoluble.

2. The positive-working type presensitized plate as set forth in claim 1, wherein the microcapsule wall is made of at least one member selected from the group consisting of a polyurea, polyurethane, polyester, polycarbonate and polyamide.

3. The positive-working type presensitized plate as set forth in claim 2, wherein the microcapsule wall is made of a polyurea and/or polyurethane.

4. The positive-working type presensitized plate as set forth in claim 1, wherein the glass transition temperature of the microcapsule wall is in the range of 60° to 300° C.

5. The positive-working type presensitized plate as set forth in claim 4, wherein the glass transition temperature of the microcapsule wall is in the range of 70° to 250° C.

6. The positive-working type presensitized plate as set forth in claim 5, wherein the glass transition temperature of the microcapsule wall is in the range of 80° to 220° C.

7. The positive-working type presensitized plate as set forth in claim 1, wherein the microcapsule wall is destroyed by pressurization.

8. The positive-working type presensitized plate as set forth in claim 1, wherein the particle size of the microcapsules is 0.01 to 10μ.

9. The positive-working type presensitized plate as set forth in claim 8, wherein the particle size of the microcapsules is 0.01 to 5μ.

10. The positive-working type presensitized plate as set forth in claim 1, wherein the photopolymerizable monomer is a compound having at least one vinyl or vinylidene group.

11. The positive-working type presensitized plate as set forth in claim 10, wherein the vinyl or vinylidene group is selected from the group consisting of an acryloyl group, methacryloyl group, allyl group, unsaturated polyester group, vinyloxy group and acrylamido group.

12. The positive-working type presensitized plate as set forth in claim 1, wherein the light-sensitive resin is selected from the group consisting of a cinnamate of polyvinyl alcohol; a light-sensitive resin comprising an azide compound and a cyclized rubber, or a styrene-butadiene copolymer; a light-sensitive diazo resin; a light-sensitive resin comprised of polyvinyl acetophenone and benzaldehyde.

13. The positive-working type presensitized plate as set forth in claim 1, wherein the microcapsules further contain a polymerization initiator.

14. The positive-working type presensitized plate as set forth in claim 1, wherein the microcapsules further contain a coloring agent.

15. The positive-working type presensitized plate as set forth in claim 14, wherein the microcapsules further contain a color precursor.

16. The positive-working type presensitized plate as set forth in claim 1, wherein the microcapsules further contain a foaming agent.

17. The positive-working type presensitized plate as set forth in claim 16, wherein the foaming agent is selected from the group consisting of nitroso type compounds, sulfohydrazido type compounds which are hydrazine derivatives of organo sulfonic acids, hydrazo compounds and azo compounds.

18. The positive-working type presensitized plate as set forth in claim 16, wherein the microcapsules further contain an auxiliary agent for thermal decomposition.

19. The positive-working type presensitized plate as set forth in claim 1, wherein the hydrophilic binder is selected from the group consisting of gelatin, derivatives thereof, derivatives of cellulose, polysaccharides, water soluble polyvinyl compounds and a combination thereof.

20. The positive-working type presensitized plate as set forth in claim 19, wherein the hydrophilic binder is selected from the group consisting of gelatin, derivatives thereof, carboxymethylcellulose, methylcellulose, starch, gum arabic, polyvinyl alcohol, polyvinylpyrrolidone, an acrylamide polymer, polyacrylic acid, a vinyl acetate-acrylic acid copolymer and a combination thereof.

21. The positive-working type presensitized plate as set forth in claim 1 wherein the microcapsules contain 50 to 90% by weight of the photopolymerizable monomer and/or light-sensitive resin.

22. The positive-working type presensitized plate as set forth in claim 21 wherein the microcapsules contain 60 to 80% by weight of the photopolymerizable monomer and/or light sensitive resin.

23. The positive-working type presensitized plate as set forth in claim 1 which contains 0.1 to 15% by weight of the hydrophilic binder.

24. The positive-working type presensitized plate as set forth in claim 23 which contains 0.2 to 10% by weight of the hydrophilic binder.

25. The positive-working type presensitized plate of claim 1 which contains 0.5 to 15 g/m$^2$ of microcapsules.

26. The positive-working type presensitized plate of claim 25 which contains 1 to 10 g/m$^2$ of microcapsules.

27. The positive-working type presensitized plate as set forth in claim 1, wherein said support is aluminum which has been subjected to surface roughing treatment.

* * * * *